(12) United States Patent
Yoo

(10) Patent No.: US 6,887,803 B2
(45) Date of Patent: May 3, 2005

(54) GAS-ASSISTED RAPID THERMAL PROCESSING

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 0 days.

(21) Appl. No.: 10/005,827

(22) Filed: Nov. 8, 2001

(65) Prior Publication Data

US 2003/0087215 A1 May 8, 2003

(51) Int. Cl.⁷ .......................... H01L 23/29; H05B 1/00; C23C 16/00
(52) U.S. Cl. ...................... 438/795; 438/530; 438/798; 438/799; 219/390; 219/405; 118/50.1; 118/725
(58) Field of Search ................................ 219/390, 405; 118/725, 50.1; 438/795, 798, 799, 530

(56) References Cited

U.S. PATENT DOCUMENTS

| 4,794,217 A | | 12/1988 | Quan et al. ................. 437/247 |
|---|---|---|---|
| 4,961,373 A | * | 10/1990 | Milone ........................ 99/355 |
| 5,177,878 A | | 1/1993 | Visser ............................ 34/92 |
| 5,462,603 A | | 10/1995 | Murakami .................. 118/719 |
| 5,647,945 A | | 7/1997 | Matsuse et al. ............. 156/345 |
| 5,683,242 A | | 11/1997 | Cronin et al. ............... 432/144 |
| 5,778,968 A | | 7/1998 | Hendrickson et al. ..... 165/80.1 |
| 5,861,609 A | | 1/1999 | Kaltenbrunner et al. .... 219/390 |
| 6,002,109 A | | 12/1999 | Johnsgard et al. .......... 219/390 |
| 6,017,779 A | * | 1/2000 | Miyasaka .................... 438/486 |
| 6,079,928 A | | 6/2000 | Theriault et al. ........... 414/217 |
| 6,159,873 A | * | 12/2000 | Takagi ........................ 438/795 |
| 6,187,133 B1 | * | 2/2001 | Knoot .................... 156/345.34 |
| 6,189,482 B1 | * | 2/2001 | Zhao et al. ............. 118/723 R |
| 6,198,074 B1 | | 3/2001 | Savas ......................... 219/390 |
| 6,232,580 B1 | * | 5/2001 | Sandhu ....................... 219/390 |
| 6,303,906 B1 | | 10/2001 | Yoo ............................ 219/390 |
| 6,393,730 B1 | * | 5/2002 | Suzuki ........................ 34/510 |
| 2001/0035124 A1 | | 11/2001 | Okayama et al. .......... 118/110 |

FOREIGN PATENT DOCUMENTS

| JP | 2000-91249 | 3/2000 |
|---|---|---|
| WO | WO 98/01890 | 1/1998 |
| WO | WO 01/82342 | 11/2001 |

* cited by examiner

Primary Examiner—Michael Trinh
(74) Attorney, Agent, or Firm—MacPherson Kwok Chen & Heid LLP; David S. Park

(57) ABSTRACT

A system, method and apparatus for processing a semiconductor device including a processing chamber and a heating assembly positioned within the processing chamber. The heating assembly including at least a plate defining an internal cavity configured to receive gas. The gas enters the internal cavity through a first passage at a first temperature, and exits the internal cavity at a second temperature through a second passage.

8 Claims, 6 Drawing Sheets

GAS-ASSISTED RAPID THERMAL PROCESSING

BACKGROUND

1. Field of the Invention

This invention generally relates to semiconductor manufacturing equipment and, more particularly, to an improved method for rapid thermal processing of a semiconductor wafer.

2. Related Art

In the semiconductor manufacturing industry, depending upon the particular process, a semiconductor wafer may be treated at temperatures of from about 100° C. to about 1300° C., under controlled conditions, in rather sophisticated furnaces. Commonly, these furnaces are horizontal or vertical type furnaces, which use various energy sources to heat the wafer, including radiant heaters, arc lamps, and tungsten-halogen lamps. As shown in FIG. 1, a typical horizontal or vertical type furnace requires a time $t_1$ for ramping up to a particular process temperature to process the wafers. The ramp up rate for a typical furnace is usually between 5° C./min to about 15° C./min, which makes time $t_1$ typically on the order of about 1 hour. A time $t_2$ is required for cooling of the wafers, which is generally on the order of about 2 hours. Long processing times are typically unacceptable in advanced semiconductor device manufacturing because of dopant redistribution, excessive costs, excessive exposure to temperature, and high power requirements.

In order to continue to make advancements in the development of semiconductor devices, especially semiconductor devices of decreased dimensions, new processing and manufacturing techniques have been developed. One such processing technique is know as Rapid Thermal Processing (RTP), which reduces the amount of time that a semiconductor device is exposed to high temperatures during processing. The rapid thermal processing technique, typically includes raising the temperature of the wafer and holding it at that temperature for a time long enough to successfully perform a fabrication process, and avoid such problems as unwanted dopant diffusion that would otherwise occur at the high processing temperatures.

SUMMARY

The present invention provides an improved system, method and structure for rapid thermal processing of a semiconductor wafer. The present invention helps to improve process times so as to avoid, for example, the creation of thermal gradients in the process chamber, which can cause slip and warpage of the wafer. The present invention adds a significant conductive heat transfer component to processes which may presently use primarily radiant heat transfer to raise the temperature of a semiconductor wafer.

In accordance with the present invention, a gas, such as He, $H_2$, $O_2$, Ar, $N_2$, and gases containing He, $H_2$, $O_2$, Ar and $N_2$, can be introduced into the processing chamber during processing. The gas is introduced through at least one heatable member, such as a heatable plate that can overlay a surface of the wafer. The heatable member includes an internal cavity in which heat is transferred to the gas. The heated gas exits the heatable member in the direction of the wafer surface through an outlet portion of the plate. The outlet portion can include a plurality of holes, which are dispersed on the plate surface so as to evenly distribute the heated gas across the surface of the wafer. Advantageously, the addition of the heated gas to the process can raise the temperature of the wafer much more quickly then without the use of the gas.

These and other features and advantages of the present invention will be more readily apparent from the detailed description of the preferred embodiments set forth below taken in conjunction with the accompanying drawings.

DETAILED DESCRIPTION

Figure 1:
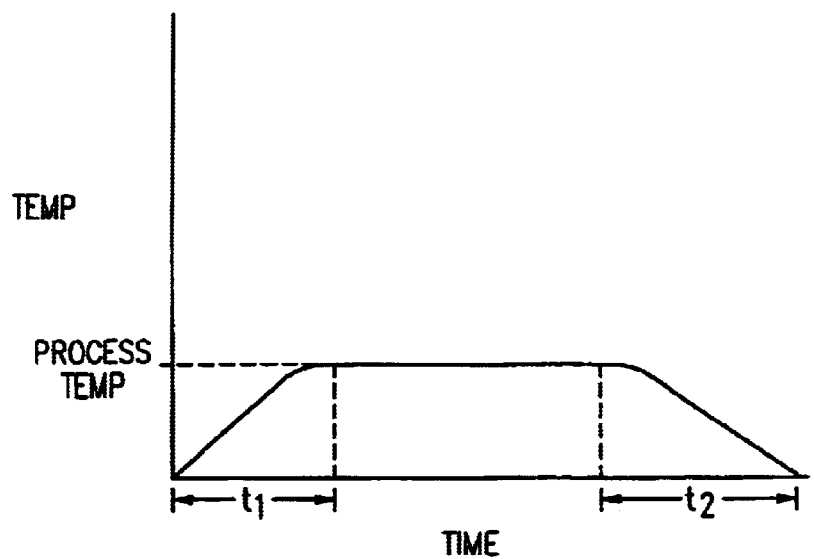
FIG. 1 is a graph representative of typical temperature heat-up and cool-down rates for a conventional wafer processing furnace.
Figure 2:
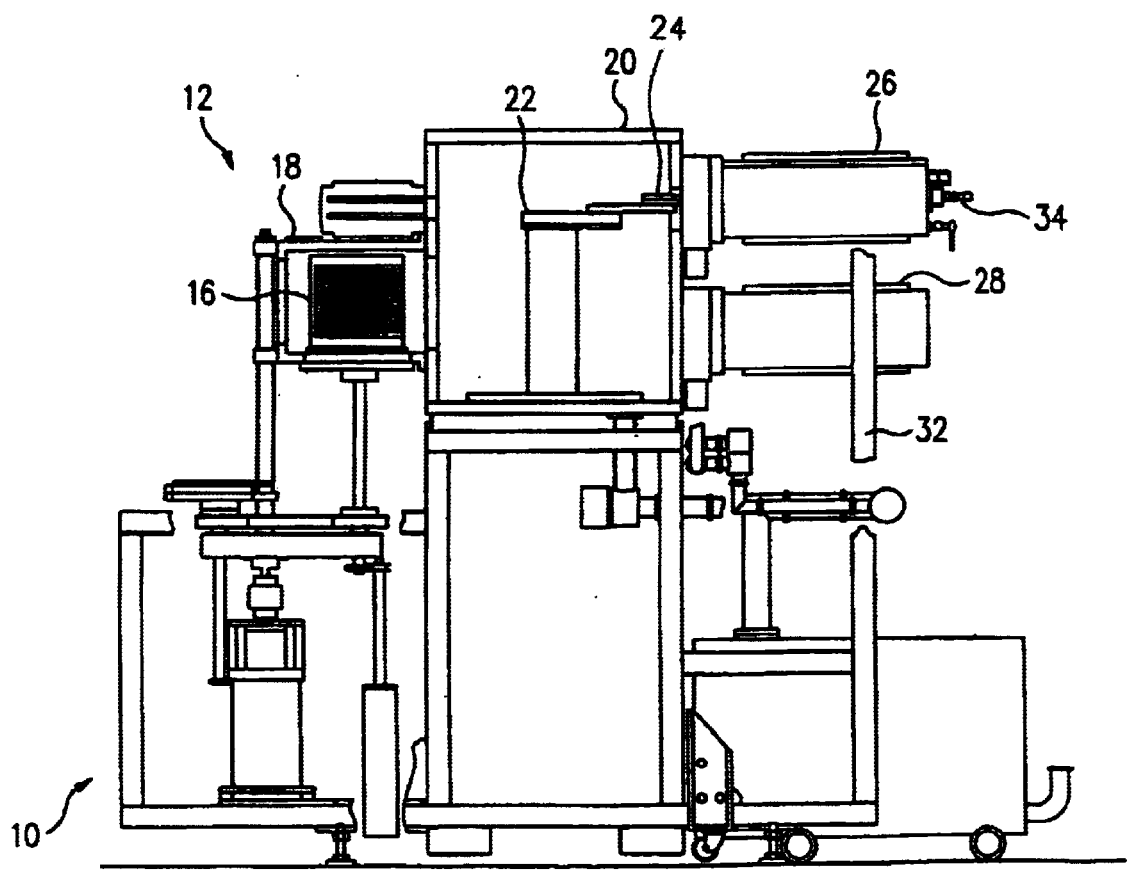
FIG. 2 illustrates schematically a side view of one embodiment of a semiconductor wafer processing system in accordance with the present invention.

FIG. 2 illustrates schematically a side view of one embodiment of a semiconductor wafer processing system 10 that establishes a representative environment of the present invention. Processing system 10 includes a loading station 12, a transfer chamber 20 and a reactor 26. A robot 22 within transfer chamber 20 rotates toward loadlock 18 and picks up a wafer 24 from cassette 16. Reactor 26, which may also be at atmospheric pressure or under vacuum pressure, accepts wafer 24 from robot 22. Robot 22 then retracts its arm which carried wafer 24 and, subsequently, the processing of wafer 24 begins.

Reactor 26 may be any type of reactor which allows wafers to be loaded at wafer processing temperatures, of between about 100° C. to about 1300° C., without adverse results. In accordance with the present invention, the reactor may be a hot-walled RTP reactor, such as is used in thermal anneals. In other embodiments, the reactor may be the type of reactor used for dopant diffusion, thermal oxidation, nitridation, chemical vapor deposition, and/or similar processes. In one embodiment, process gases, coolant, and electrical connections may be provided through the rear end of the reactors using interfaces 34.

Figure 3A:
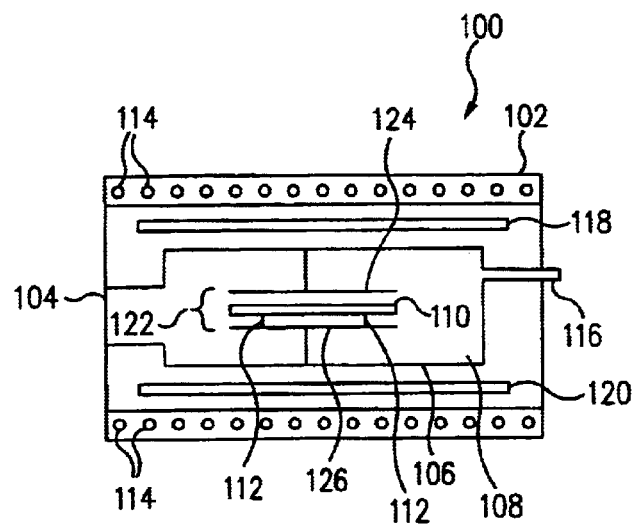
FIG. 3A is a simplified cross-sectional illustration of an embodiment of a processing chamber in accordance with the present invention.

FIG. 3A is a simplified cross-sectional illustration of an embodiment of a reactor 100 in accordance with the present invention. Reactor 100 may generally include a closed-end process chamber 106, which defines an interior cavity 108. Process chamber 106 may be constructed with a substantially rectangular cross-section, having a minimal internal volume surrounding wafer 110. In one embodiment, the volume of process chamber 106 may be no greater than about 5000 cm$^3$, preferably less than about 3000 cm$^3$. One result of the small volume is that uniformity in temperature is more easily maintained. Additionally, the small process chamber volume allows reactor 100 to be made smaller, and as a result, processing system 10 may be made smaller, requiring less clean room floor space. Process chamber 106 may be made of aluminum, quartz or other suitable material, such as silicon carbide or $Al_2O_3$. To conduct a process, process chamber 106 should be capable of being pressurized. Typically, process chamber 106 should be able to withstand internal pressures of about 0.001 Torr to 1000 Torr, preferably between about 0.1 Torr and about 760 Torr.

Opening 104, shown at the left end of process chamber 106, provides access for the loading and unloading of wafer 110 before and after processing. Opening 104 may be a relatively small opening, but with a height and width large enough to accommodate a wafer of between about 0.5 to 2 mm thick and up to about 300 mm (~12 in.) in diameter, and the arm of robot 22 passing therethrough. The height of opening 104 is no greater than between about 18 mm and 50 mm, and preferably, no greater than 20 mm. The relatively small opening size helps to reduce radiation heat loss from process chamber 106, and keeps down the number of particles entering cavity 108 to allow for easier maintenance of the isothermal temperature environment.

In one embodiment, a plurality of heating elements 114 surround a top and a bottom portion of process chamber 106. Resistive heating elements 114 may be disposed in parallel across chamber 106 such that each element 114 is in relative close proximity to each other element 114. For example, each resistive heating element 114 may be spaced between about 5 mm and 50 mm apart; preferably between about 10 mm and 20 mm apart. Accordingly, the close spacing of heating elements 114 provides for an even heating temperature distribution across the wafer positioned in cavity 108. Resistive heating element 114 may include a resistive heating element core and a filament wire. The core is usually made of a ceramic material, but may be made of any high temperature rated, non-conductive material. The filament wire is conventionally wrapped around the core to allow an optimal amount of heat energy to radiate from the element. The filament wire may be any suitable resistively heatable wire, which is made from a high mass material for increased thermal response and high temperature stability, such as SiC, SiC coated graphite, graphite, NiCr, AlNi and other alloys. Preferably, the resistive heating filament wire is made of a combination Al—Ni—Fe material, known commonly as Kantal A-1 or AF, available from Omega Corp. of Stamford, Conn.

A direct line voltage of between about 100 volts and about 500 volts may be used to power the resistive elements. Thus, in this embodiment no complex power transformer is needed for controlling the output of resistive heating elements 114.

In one embodiment, reactor 100 includes heat diffusing members 118 and 120, which are positioned proximate to and typically overlay heating elements 114. Heat diffusing members 118 and 120 absorb the thermal energy output from heating elements 114 and dissipate the heat evenly within chamber 106. It should be appreciated that by heating wafer 110 from above and below, and further by keeping the distance between heat diffusing members 118 and 120 small, the temperature gradient within chamber 106 is more easily isothermally maintained. Heat diffusing members 118 and 120 may be any suitable heat diffusing material that has a sufficiently high thermal conductivity, preferably Silicon Carbide, $Al_2O_3$, or graphite.

Figure 3B:
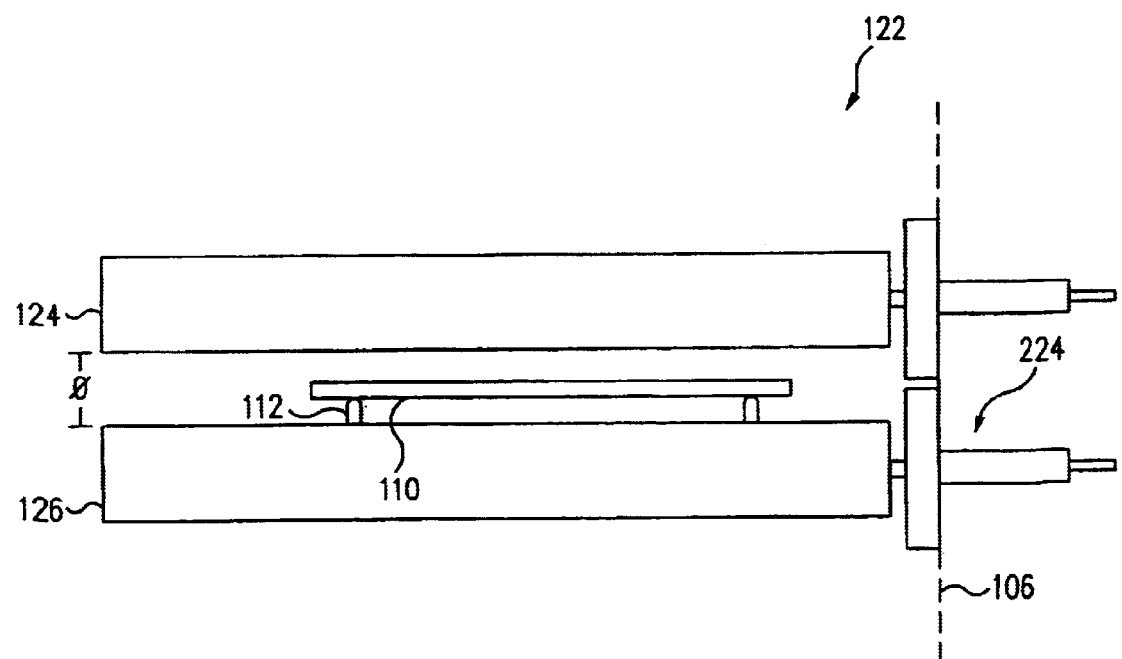
FIG. 3B is a simplified illustration of a side view of a heating assembly in accordance with the present invention.

As further illustrated in FIGS. 3A and 3B, in one embodiment, reactor 100 includes a heating assembly 122. Heating assembly 122 includes two heatable members or top plate 124 and bottom plate 126 positioned, as shown in FIG. 3, adjacent and opposed to one another. Top plate 124 is spaced apart from bottom plate 126 a distance $\phi$ which allows wafer 110 to be placed therebetween. For example, the distance $\phi$ between plates 124 and 126 can be between about 10 mm to about 50 mm.

Heating plates 124 and 126 of heating assembly 122 may have a large mass relative to wafer 110, and may be fabricated from a material, such as silicon carbide, quartz, Inconel, aluminum, steel, or any other material that does not react at processing temperatures with any ambient gases or with wafer 110.

Arranged on a top surface of bottom plate 126 may be wafer supports 112. In one embodiment, wafer supports 112 extend outward from the surface of bottom plate 126 to support wafer 110. Wafer supports 112 are sized to ensure that wafer 110 is held in close proximity to bottom plate 126. For example, wafer supports 112 may each have a height of between about 50 $\mu$m and about 20 mm, preferably about 2 mm to about 8 mm. The present invention includes at least three wafer supports 112 to ensure stability. However, the total area of contact between wafer supports 112 and wafer 110 is less than the size of the wafer.

Top and bottom plates 124 and 126 may be formed into any geometric shape, preferably a shape which resembles that of the wafer. In one embodiment, plates 124 and 126 are circular plates. The dimensions of plates 124 and 126 may be larger than the dimensions of wafer 110, such that the surface area of wafer 110 can be completely overlaid by the surface area of heating plates 124 and 126. In one example, the circular diameters of heating plates 124 and 126 is greater than the diameter of wafer 110. For example, as illustrated in FIG. 4A, the radius of bottom heating plate 126 is greater than the radius of wafer 110 by about a length $\gamma$, which can range between about 1 mm and 100 mm, preferably 25-to-50 mm.

Figure 4A:
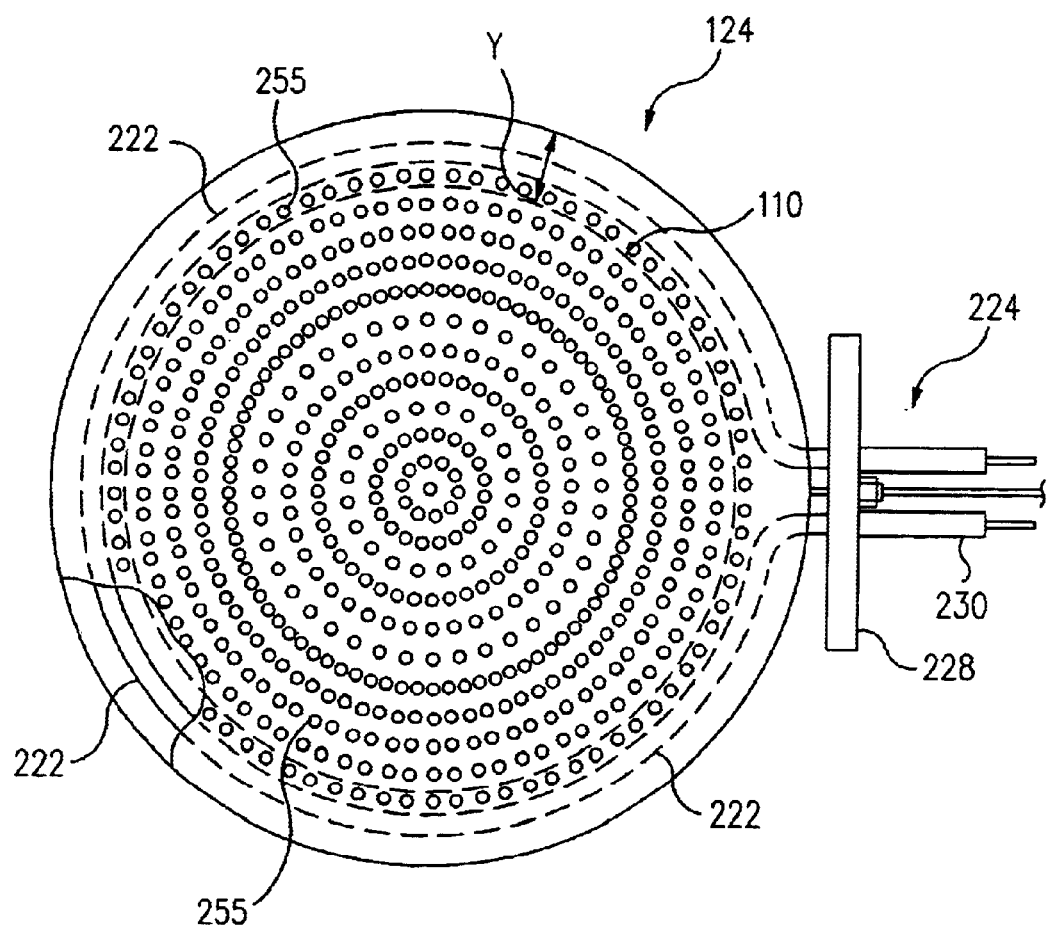
FIG. 4A is a top view of a heatable plate including standoffs for holding a wafer in accordance with an embodiment of the present invention.

For convenience of understanding, FIG. 4A illustrates an embodiment of a heatable member, for example, top plate 124. It should be understood that top plate 124 is similar in structure and function to bottom plate 126, and the description of top plate 124 is the same as for bottom plate 126, unless otherwise noted. In accordance with one embodiment of the present invention, on a periphery of heating top plate 124 is at least one heat source 222. Heat source 222 may be a resistive heating element or other conductive heat source, which can be made to contact a peripheral portion of top heating plate 124 or may be embedded within top heating plate 124. The resistive heating element may be made of any high temperature rated material, such as a suitable resistively heatable wire, which is made from a high mass material for increased thermal response and high temperature stability, such as SiC, SiC coated graphite, graphite, AlCr, AlNi and other alloys. Resistive heating elements of this type are available from Omega Corp. of Stamford, Conn. Alternatively, top heating plate 124 can be heated using a radiant source.

In one embodiment, plates 124 and 126 may be positioned suspended within process chamber 106, in a cantilevered relationship on a wall of the process chamber. In this embodiment, coupling mechanism 224 includes a mounting bracket 228 and electrical leads 230 to provide an electrical power connection to heat source 222. Mounting bracket 228 can be coupled to an internal wall of process chamber 106 using conventional mounting techniques. Once mounted, electrical leads 230 can extend outside of process chamber 106 to be connected to an appropriate power source. The power source may be a direct line voltage of between about 100 volts and about 500 volts. Alternatively, top plate 124 may hang suspended from mounts emanating down from a ceiling of process chamber 106 and bottom plate 126 may rest on mounts emanating up from a floor of process chamber 106.

Figure 4B:
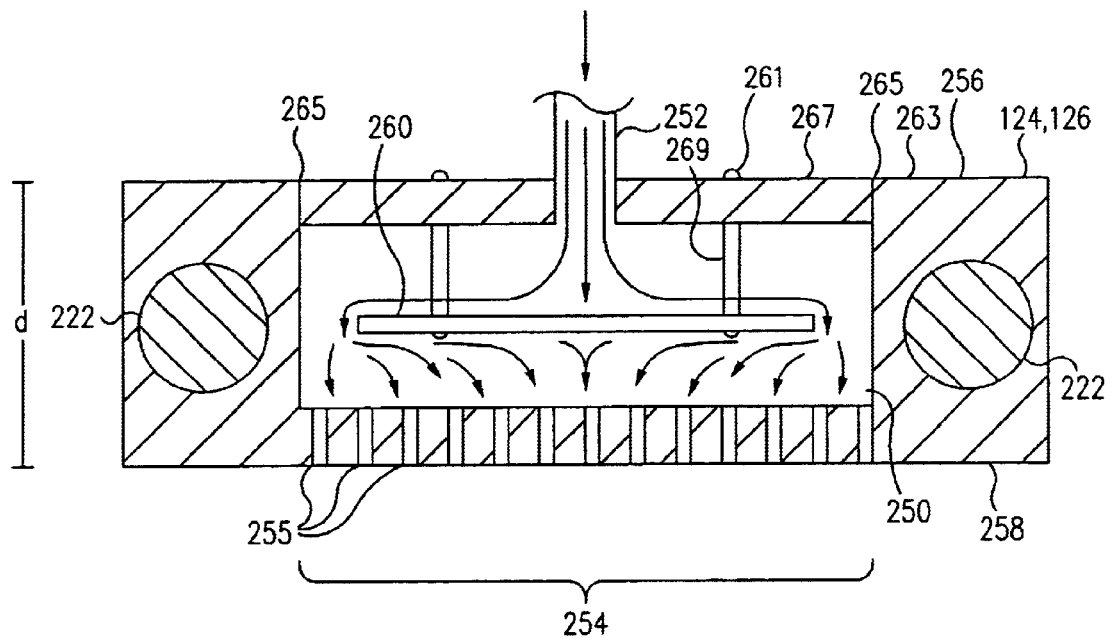
FIG. 4B is a cross-sectional view of the heatable plate of FIG. 4A.

FIG. 4B is a simplified cross sectional view of heating plate 124, 126, in accordance with the present invention. Heating plates 124, 126 can include a hollowed out portion defining an internal cavity 250. Internal cavity 250 has an inlet 252, which enters internal cavity 250 on a first side 256 of plate 124, 126. Inlet 252 allows a gas to be fed from a gas reservoir (not shown) into internal cavity 250. The gas may include, for example, any suitable gas, such as He, $H_2$, $O_2$, Ar, $N_2$ and the like.

Internal cavity 250 has an outlet portion 254, which is defined on a second side 258 of plate 124, 126. Outlet portion 254 allows the gas that has entered internal cavity 250 to escape the cavity. In one embodiment, outlet portion 254 can be defined as a plurality of outlets or holes 255. Holes 255 can be any suitable size that allow passage of the gas. In one example, holes 255 may be between about 0.1 mm to about 2 mm in diameter.

In one embodiment, internal cavity 250 may include a baffle 260, positioned between inlet 252 and outlets 255. In this embodiment, baffle 260 impedes the flow of the gas entering through inlet 252. By impeding the otherwise forced gas flow before exiting through outlets 255, the gas is made to reside in internal cavity 250 for a longer time period, which allows more heat to be transferred to the gas before the gas exits the cavity.

In one embodiment, the thickness of top and bottom plates 124 and 126 is any thickness d suitable for accommodating heat source 222 and for providing an adequately sized internal cavity 250. The thickness d can range from between 1 cm and 10 cm; preferably about 3 cm. In one example, plates 124 and 126 can be fabricated using a split construction, which means that each plate is originally two pieces 263 and 267, joined at seam 265, for example, by welding. Baffle 260 can be mounted onto piece 267, for example, using attaching device 261, such as screws, nuts and bolts, rivets and the like and a spacer 269. It should be noted that one of ordinary skill in the art may fabricate plates 124 and 126 using a variety of well known techniques, all of which fall within the scope of the present invention. Generally, plates 124 and 126 may be made of materials, such as Al, and Al alloys Ni, Inconel, Mo, stainless steel, SiC and the like.

Figure 5:
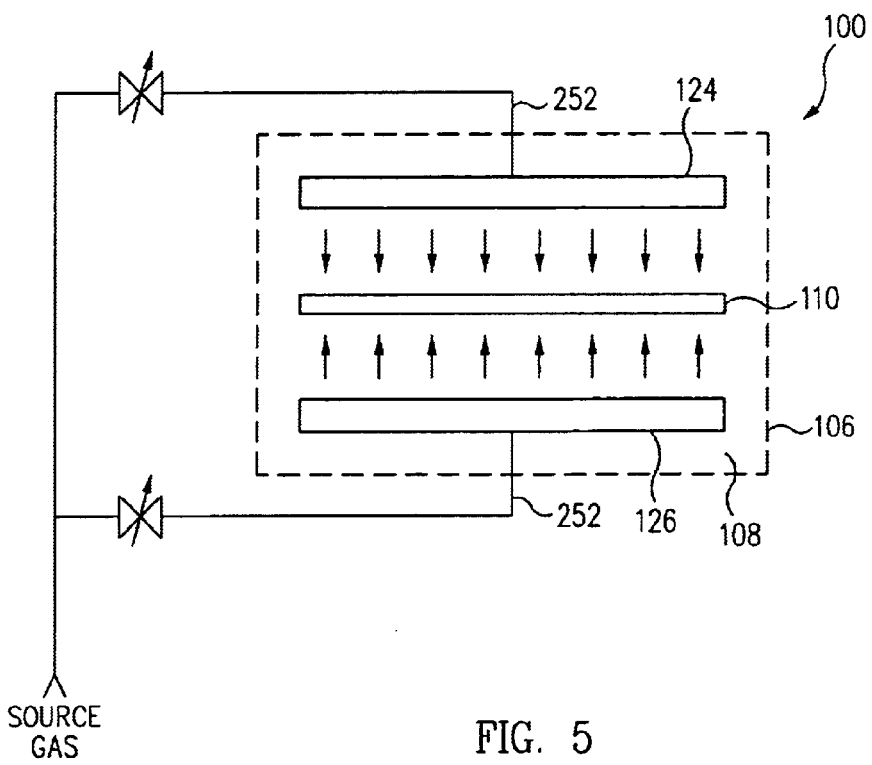
FIG. 5 is a simplified cross-sectional illustration of an embodiment with directional gas flow indications in accordance with the present invention.
Figure 6:
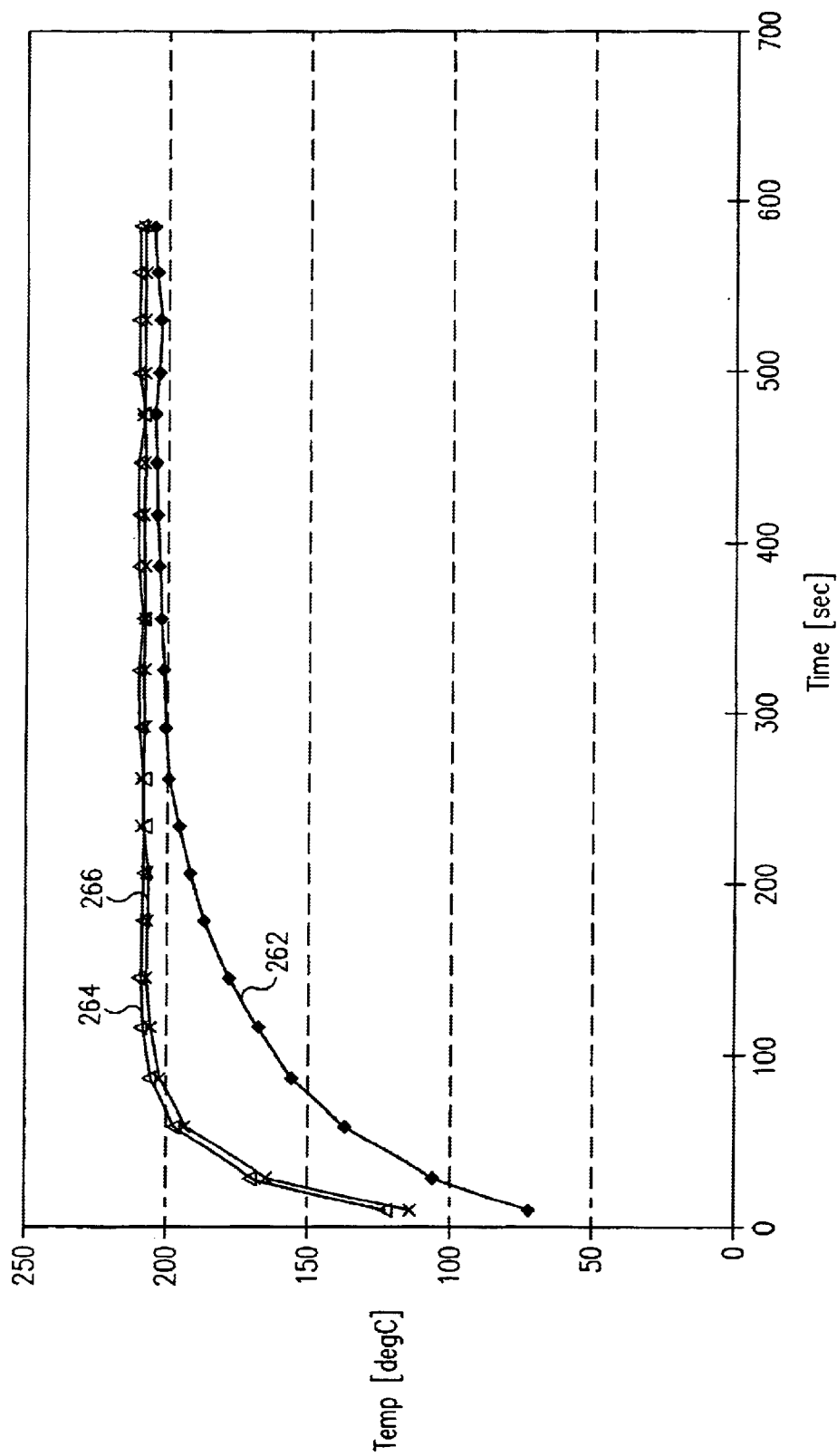
FIG. 6 is a graph comparing wafer temperature as a function of time between a wafer disposed in the process chamber of FIG. 3 without gas flow and a wafer disposed in the process chamber of FIG. 3 with gas flow in accordance with principles of the present invention.

Referring now to FIGS. 4B, 5 and 6, in operation, internal cavity 250 serves as a heat exchanger, such that the gas can be heated as it travels from inlet 252 through to the exit points of outlets 254. The entering gas can be at ambient temperature or may be pre-heated prior to entering internal cavity 250. The gas is made to move through internal cavity 250 which may be heated by heat source 222 to between approximately 100° C. and 1000° C. It should be understood that the temperature of the gas exiting internal cavity 250 depends on, for example, the type of gas, the flow rate of the gas, the residence time of the gas in internal cavity 250 and the nominal temperature of internal cavity 250. Each of these parameters can be adjusted until the exiting gas temperature is appropriate for a specific process.

As shown in FIG. 5, in one embodiment, wafer 110 is placed between top and bottom plates 124 and 126 and a gas, such as $N_2$, is allowed to flow through internal cavity 250 of top plate 124. In this example, the gas enters internal cavity 250 at approximately room temperature (25° C.). The gas is heated by radiation and conduction as it passes through cavity 250 and exits outlets 255.

FIG. 6 is a graph showing an exemplary result of a heating process using the configuration of FIG. 5. In this example, heat source 222 is set to about 220° C., which causes the gas to exit outlets 255 at approximately 215° C.

As illustrated by line 264 in FIG. 6, allowing gas to flow through top plate 124 only, wafer 110 reaches the temperature of approximately 220° C. in about 60 seconds. Line 266 illustrates approximately the same heating profile if gas is allowed to simultaneously flow through bottom plate 126. For comparison, line 262 represents the heating profile of wafer 110 without gas flow through either top plate 124 or bottom plate 126. As illustrated by line 262, approximately 270 seconds are required to first heat wafer 110 to approximately 210° C.

Figure 7:
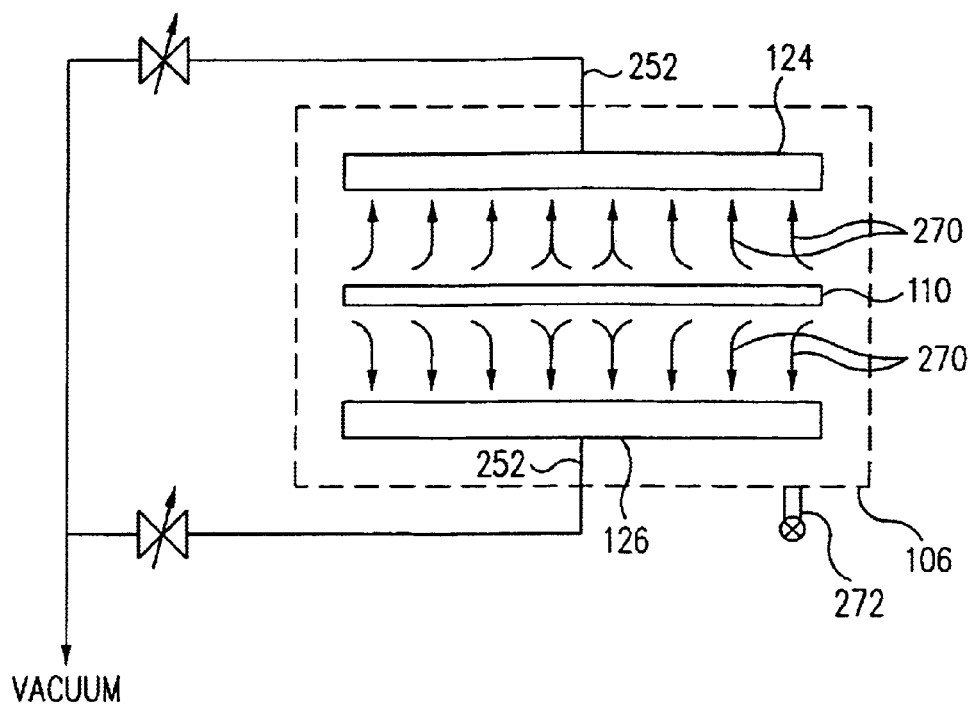
FIG. 7 illustrates an alternative embodiment of the process chamber of FIG. 3 used for cooling a wafer.

FIG. 7 is a simplified illustration of another embodiment in accordance with the present invention. In this embodiment, process chamber 106 is structurally the same as in other embodiments, including top plate 124 and bottom plate 126. However, instead of heating the gas as it enters chamber 106, gas is removed from chamber 106, through top plate 124 and bottom plate 126 to provide forced convection cooling of wafer 110. In operation, when cooling is desired, a vacuum is pulled through inlets 252 to cause gas to flow out from chamber 106 in a direction generally indicated by air flow arrows 270 and into outlets 255. In this embodiment, outlet portion 254 becomes an inlet to internal cavity 250 and gas inlet 252 provides an outlet for internal cavity 250.

In one embodiment, an exhaust port 272 in chamber 106 can be opened to provide ambient air for cooling. As the ambient air is moved over the surface of wafer 110, the wafer surface is cooled. In one embodiment, the cooling rate can range from between approximately 5° C./sec and 20° C./s.

Figure 8:
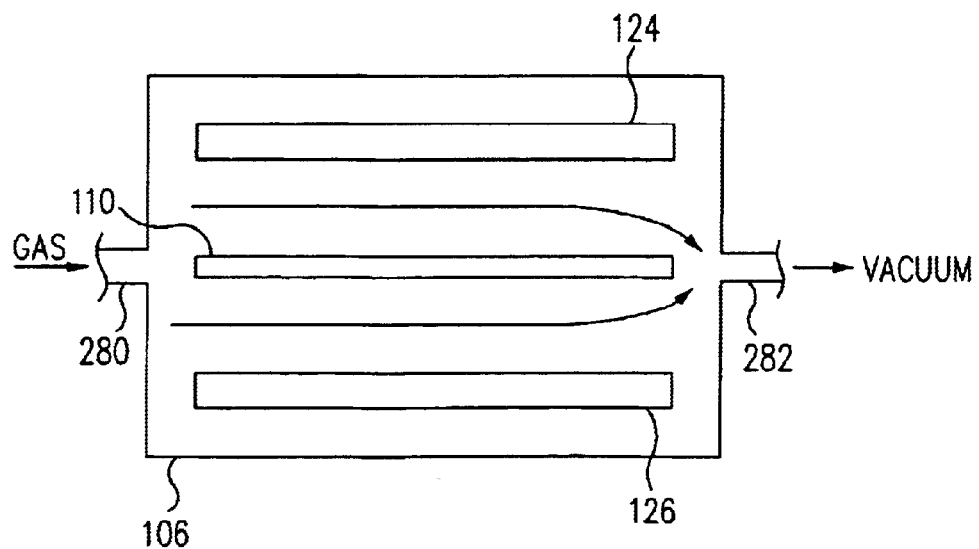
FIG. 8 illustrates yet another alternative embodiment of the process chamber of FIG. 3 used for cooling a wafer.

FIG. 8 shows another embodiment for moving gas over the surface of wafer 110. In this embodiment, a gas inlet 280 is positioned on chamber 106 approximately in-line and parallel to wafer 110. An outlet or exhaust port 282 is also positioned in-line and parallel to wafer 110, and approximately in-line with inlet 280. In operation as a gas is allowed into chamber 106 through inlet 280, outlet port 282, under vacuum, causes the gas to flow over wafer 110 providing a force convection cooling effect.

Having thus described embodiments of the present invention, persons skilled in the art will recognize that changes may be made in form and detail without departing from the spirit and scope of the invention. Thus the invention is limited only by the following claims.

What is claimed is:

1. A system for processing a semiconductor device, the system comprising:
   a processing chamber heated by heating elements;
   a first plate positioned within said processing chamber and defining a first internal cavity configured to receive a first gas through a first passage into said first internal cavity at a first temperature and to emit said first gas from said first internal cavity at a second temperature through a second passage; and a second plate disposed adjacent to said first plate, said first plate and said second plate provided between said heating elements and defining a processing area therebetween, said second plate defining a second internal cavity configured to receive a second gas through a first passage into said second internal cavity at a first temperature and to emit said second gas from said second internal cavity at a second temperature through a second passage, said first emitted gas and said second emitted gas varying the temperature of said processing area.

2. The system of claim 1, wherein said second passage comprises a plurality of holes defined on a surface of said first and said second plates.

3. The system of claim 1, wherein said first plate and said second plate comprise a heat source for heating said plate to a preselected temperature.

4. The system of claim 1, wherein said first gas is taken from the group consisting of $N_2$, He, $H_2$, $O_2$, Ar and gas mixtures containing He, $H_2$, $O_2$, Ar and $N_2$.

5. The system of claim 1, wherein said internal cavity further comprises a buffer to disperse said first gas throughout said internal cavity.

6. A system for water processing comprising:
a chamber heated by heating elements; and
a first heatable plate and a second heatable plate positioned between said heating elements within said chamber, and defining a processing area therebetween, each of said heatable plates including:
an internal cavity defining an internal wall and configured to receive a gas;
means for heating said internal wall to a preselected temperature; and
an outlet portion defining a plurality of holes for emitting said gas to said processing area;
said gas varying the temperature of said processing area.

7. The system of claim 6, wherein said gas is taken from the group consisting of He, $H_2$, $O_2$, Ar, $N_2$ and gas mixtures containing He, $H_2$, $O_2$, Ar, and $N_2$.

8. The system of claim 6, wherein said internal cavity further comprises a buffer to disperse said first gas throughout said internal cavity.

* * * * *